(12) United States Patent
Aoki et al.

(10) Patent No.: US 6,900,482 B2
(45) Date of Patent: May 31, 2005

(54) SEMICONDUCTOR DEVICE HAVING DIVIDED ACTIVE REGIONS WITH COMB-TEETH ELECTRODES THEREON

(75) Inventors: Yoshio Aoki, Yamanashi (JP); Yutaka Mimino, Yamanashi (JP); Osamu Baba, Yamanashi (JP); Muneharu Gotoh, Yamanashi (JP)

(73) Assignee: Fujitsu Quantum Devices Limited, Nakakoma-gun (JP)

(*) Notice: Subject to any disclaimer, the term of this patent is extended or adjusted under 35 U.S.C. 154(b) by 0 days.

(21) Appl. No.: 10/096,856

(22) Filed: Mar. 14, 2002

(65) Prior Publication Data

US 2002/0140024 A1 Oct. 3, 2002

(30) Foreign Application Priority Data

Mar. 30, 2001 (JP) ........................... 2001-099957

(51) Int. Cl.[7] ............ H01L 29/80; H01L 31/112; H01L 29/76
(52) U.S. Cl. .............. 257/275; 257/276; 257/272; 257/256; 257/401
(58) Field of Search ..................... 257/275, 276, 257/272, 256, 327, 401, 390

(56) References Cited

U.S. PATENT DOCUMENTS 5,652,452 A * 7/1997 Asano ................... 257/401
5,852,318 A * 12/1998 Chikamatsu et al. ....... 257/390

FOREIGN PATENT DOCUMENTS

| JP | 04-171734 | 6/1992 | |
| JP | 05-175247 | 7/1993 | |
| JP | 06-005849 | 1/1994 | |
| JP | 06-140437 | 5/1994 | |
| JP | 08-083808 | 3/1996 | |
| JP | 8-250671 | * 9/1996 | ............. 257/275 |
| JP | 2000-332030 | 11/2000 | |

* cited by examiner

Primary Examiner—Steven Loke
(74) Attorney, Agent, or Firm—Armstrong, Kratz, Quintos, Hanson & Brooks, LLP

(57) ABSTRACT

A high-frequency semiconductor device for power amplification has a comb-teeth electrode on each of active regions formed on the front surface of the semiconductor substrate. One aspect of the present invention, there is provided a monolithic microwave integrated circuit (MMIC) having a plurality of rectangular-shaped active regions arranged side by side on the front surface of the semiconductor substrate, each of the active regions having interdigited gate, drain and source electrodes thereon which are connected to the respective pads by multilayer interconnection technique. Additionally, the source potential is fed from the back surface of the substrate through a metal plugged via-hole.

10 Claims, 10 Drawing Sheets

SEMICONDUCTOR DEVICE HAVING DIVIDED ACTIVE REGIONS WITH COMB-TEETH ELECTRODES THEREON

BACKGROUND OF THE INVENTION

1. Field of the Invention

The present invention relates to a semiconductor device for power amplification, and more particularly, to arrangement of active regions and electrodes for power transistors.

2. Description of the Related Art

A power semiconductor device using compound semiconductor materials for various applications such as local ground stations of mobile telephone network requires characteristics of high-speed operation and low power consumption. FIGS. 1A and 1B are a top view and a cross-sectional view in a unit transistor region of a conventional power semiconductor device, respectively. Hereinafter, the same numerals are designated to the same elements in all figures. As shown in FIGS. 1A and 1B, a conventional field effect transistor for power amplification (or a power FET) comprises a parallel array of unit transistors 11 disposed in an active region 10 on a compound semiconductor substrate 15 such as gallium-arsenide (or GaAs), in which each of the unit transistors 11 has a gate finger 1, a drain finger 2 and a source finger 3. A gate bar 4 connects all of the gate fingers 1 to a gate pad 5 in parallel, a drain bar 6 connects all of the drain fingers 2 to a drain pad 7 in parallel connection and a source bar 8 connects all of the source fingers 3 to a source pad 9 in parallel connection. In this configuration of the power FET, the channel width must increase in order to increase the power amplification. However, the increase of the channel width needs the corresponding increase of the gate finger 1, a drain finger 2 and a source finger 3 lengthwise, which results in degradation of device characteristics due to increase of inner resistance of the respective fingers. To avoid this problem, it could be possible to increase the numbers of parallel transistors maintaining the channel width unchanged, by which the power amplification would be increased without increase of the inner resistance, but the increase of the numbers of parallel transistors by simple increase of the active region in the channel-length direction leads to increase in length of the respective bars, which results in an adverse effect that difference in distance from a pad to each of transistors increases because the distance depends upon relative disposition of the respective transistor to the pad. For this reason, the larger difference in the distance incurs more difficulty in a high-speed parallel operation.

SUMMARY OF THE INVENTION

An object of the present invention is to provide a semiconductor device for power amplification attaining a desired power amplification without degradation of the above-mentioned device characteristics.

According to the first feature of the present invention, a semiconductor device comprises active regions formed in plural in a direction perpendicular to a length direction of fingers of gate, drain and source electrodes, arranged in plural repetitions in a direction parallel to a length direction of fingers of gate, drain and source electrodes on the front surface of said semiconductor substrate, and an upper conducting layer crossing over the active regions overlaid with an insulating layer, the upper conducting layer supplying at least one of the gate, drain and source electrodes with a corresponding electric potential, wherein the gate, drain and source electrodes are formed on each of the active regions.

According to the second feature of the present invention, the active regions are electrically separated from each other.

According to the third feature of the present invention, the upper conducting layer connects at least one of the gate, drain and source electrodes with a pad to supply the corresponding electric potential therewith.

According to the fourth feature of the present invention, each of gate, source and drain bars is formed in a region electrically separated from the active regions on the front surface of the semiconductor substrate, and connected to the gate, drain and source electrodes, respectively to supply respective common electrical potentials therewith.

According to the fifth feature of the present invention, the upper conducting layer is connected to at least one of the gate, source and drain bars to supply the corresponding common electrical potential therewith. According to the sixth feature of the present invention, the gate bar is laid out between the active regions, and commonly connected with each of the gate fingers on the corresponding ones of the active regions.

According to the seventh feature of the present invention, the gate bar crosses under either the drain or source electrode at each point where the gate bar crosses either the drain or source electrode.

According to the eighth feature of the present invention, the active regions are arranged along a direction perpendicular to the length direction of the fingers.

According to the ninth feature of the present invention, a via-hole penetrating through the semiconductor substrate is formed in a region surrounded by four of the active regions adjacent to each other in both directions parallel and perpendicular to the length direction of the fingers.

According to the tenth feature of the present invention, the via-hole is plugged in with an electrode propagating an electric potential between the front surface and the back surface of the semiconductor substrate.

According to the eleventh feature of the present invention, the electrode plugged in the via-hole is connected to one of the gate, source and drain potentials.

BRIEF DESCRIPTION OF THE DRAWINGS

The present invention will be more apparent from the following description, when taken to conjunction with the accompanying drawings, in which.

DESCRIPTION OF THE PREFERRED EMBODIMENT

Embodiment 1

Figure 1A:
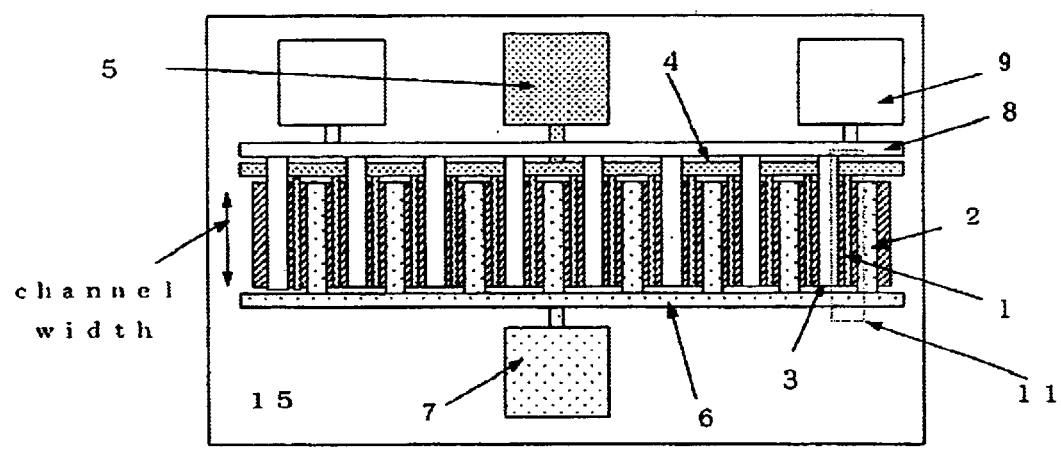
FIG. 1A is a top view of a power FET of prior art.
Figure 1B:
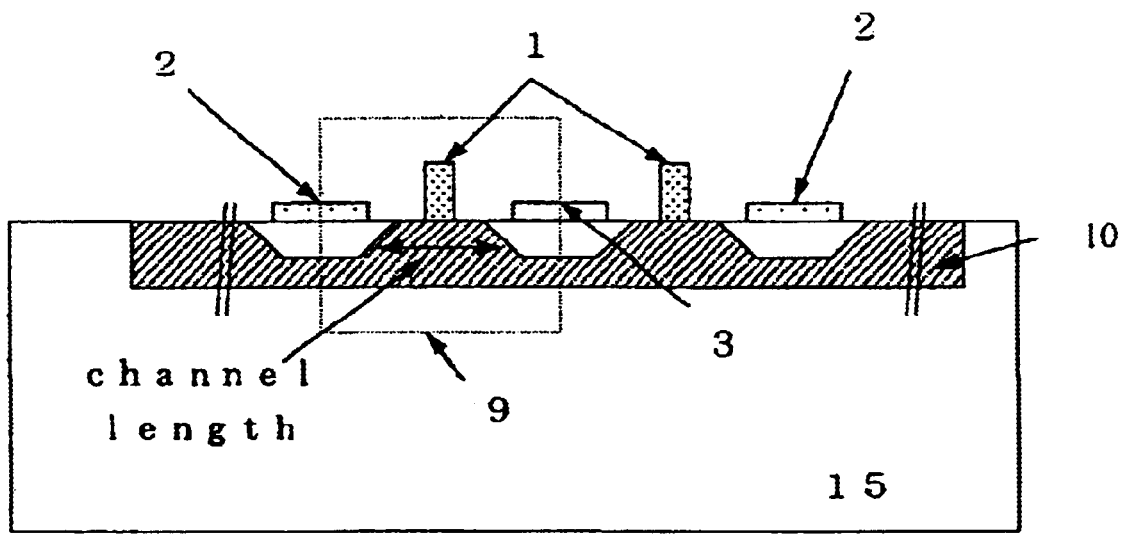
FIG. 1B is a cross-sectional view of a unit transistor region of the power FET shown in FIG. 1A.
Figure 2:
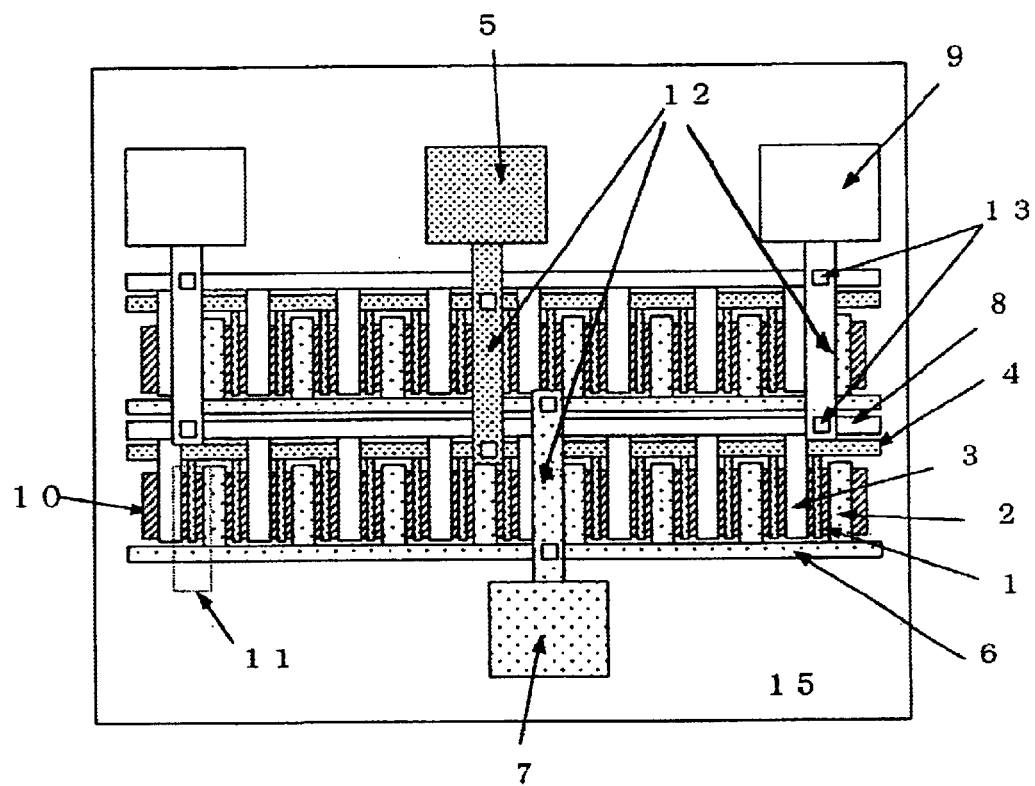
FIG. 2 is a top view of a power FET for the first embodiment according to the present invention.

FIG. 2 a top view of a power FET for the first embodiment according to the present invention.

As shown in FIG. 2, a pair of parallel rectangular-shaped active regions 10 are formed on the front surface of the substrate 15. An array of parallel transistors are formed in each of the active regions. Each of the gate, drain and source fingers is laid out in tandem in the direction of finger-length on the pair of the active regions. Since this configuration prevents each of the gate, drain and source bars from increasing in length, and suppresses increase of difference in distance from each of the pads to all of the corresponding fingers, depending upon disposition of the transistors in one of the active regions, each of the gate, drain and source bars can supply an identical electric potential to all of the corresponding fingers essentially at the same time. Each of the bars is extended in perpendicular to the corresponding fingers, and each of the bars and the corresponding fingers are made of the same conducting layer. On the other hand, each of the bars is electrically connected to the corresponding pad by an upper conducting layer 12 via through-holes 13 of an insulating layer. The upper conducting layer 12 crosses over the bars with the insulating layer therebetween. Thus, since a single bar can supply a common potential to the corresponding fingers in the parallel pair of the active regions 10, each of the pads is electrically connected to the corresponding fingers by the shortest conducting path.

Embodiment 2

Figure 3:
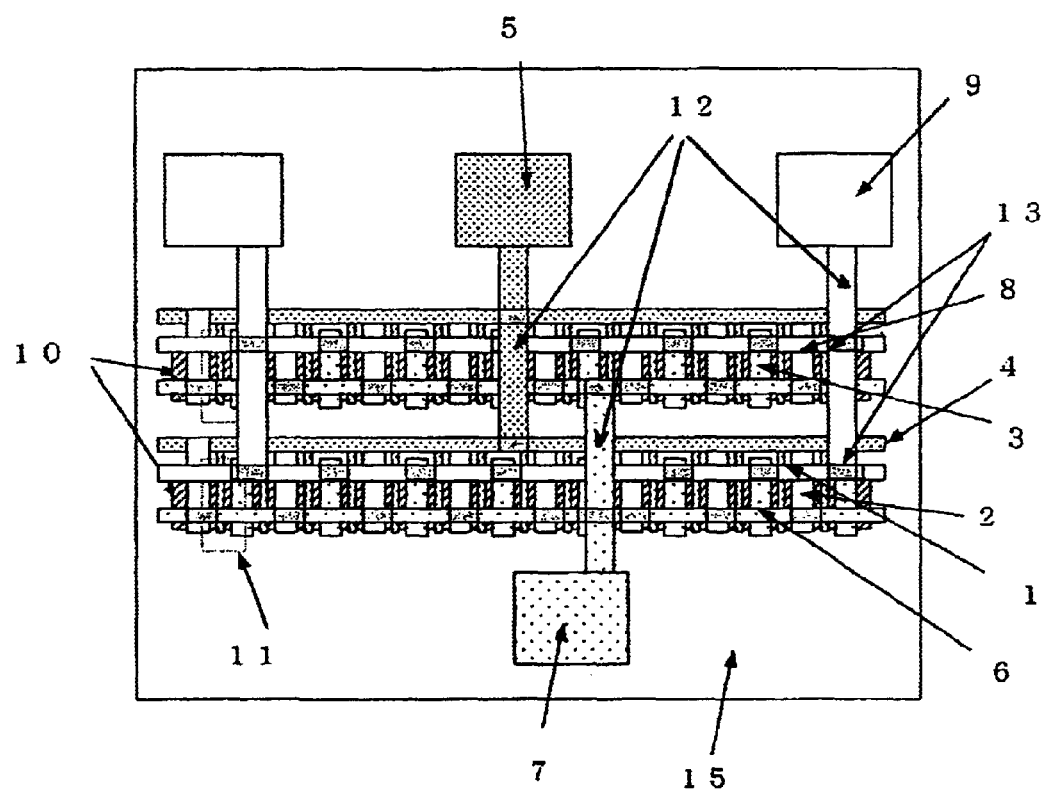
FIG. 3 is a top view of a power FET for the second embodiment according to the present invention.

FIG. 3 is a top view of a power FET for the second embodiment according to the present invention.

As shown in FIG. 3, a transistor area can be saved by laying out the drain bar and source bar on the drain fingers and source fingers, respectively, in which an electric connection between the bar and fingers is made by a via-hole. Although only a pair of gate fingers arranged in tandem are shown by the embodiments in FIGS. 2 and 3, a triple or a multiple more than a pair arrangement is within the scope of the present invention.

Embodiment 3

Figure 4:
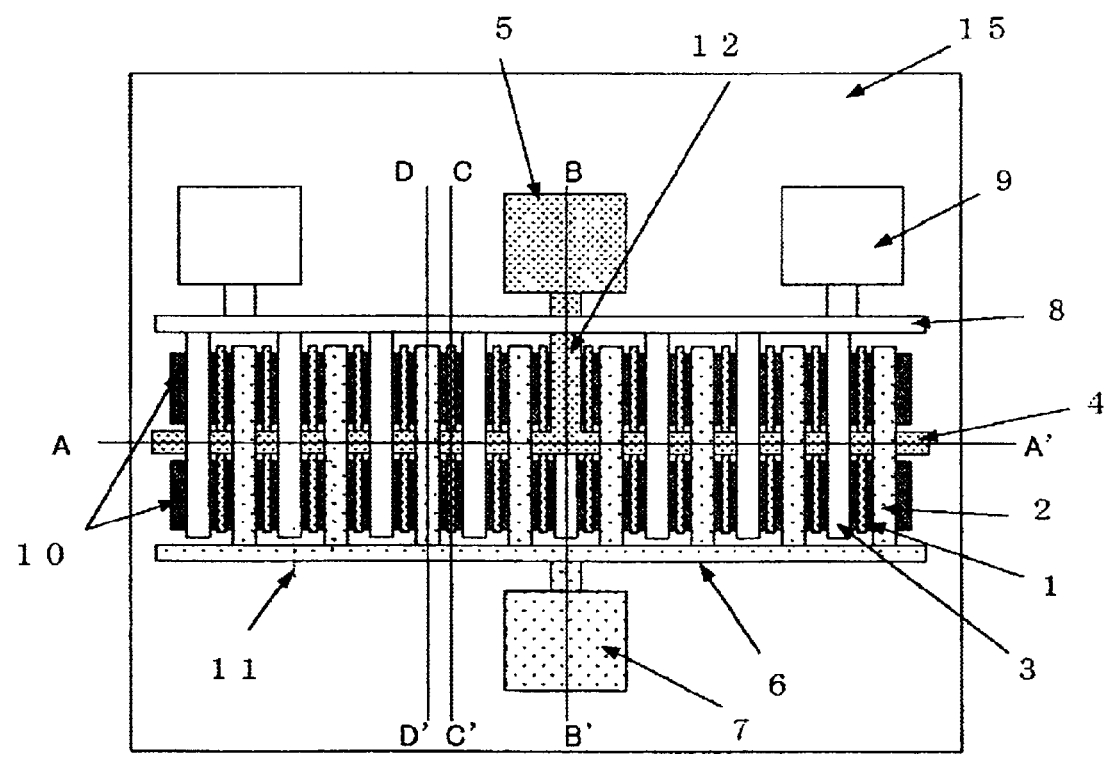
FIG. 4 is a top view of a power FET for the third embodiment according to the present invention.

FIG. 4 is a top view of a power FET for the third embodiment according to the present invention, more specifically a 3-dimensional monolithic microwave integrated circuit (MMIC).

FIGS. 5–8 are cross-sectional views of the power FET along A–A', B–B', C–C' and D–D' lines shown in FIG. 4, respectively.

Figure 5:
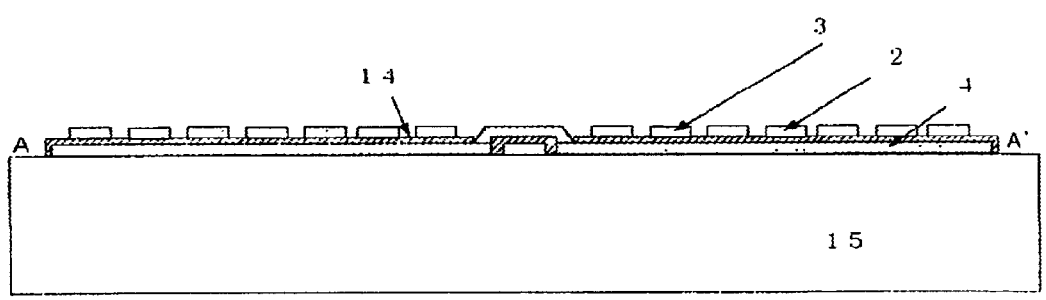
FIG. 5 is a cross-sectional view of the power FET along A–A' line shown in FIG. 4.
Figure 6:
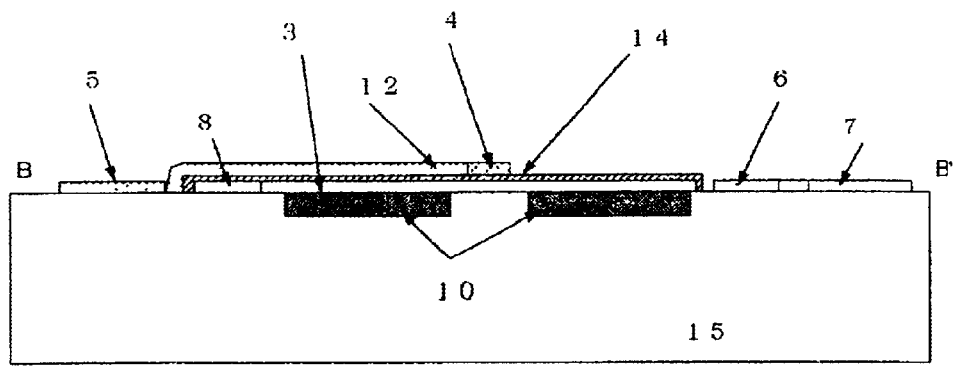
FIG. 6 is a cross-sectional view of the power FET along B-B' line shown in FIG. 4.
Figure 7:
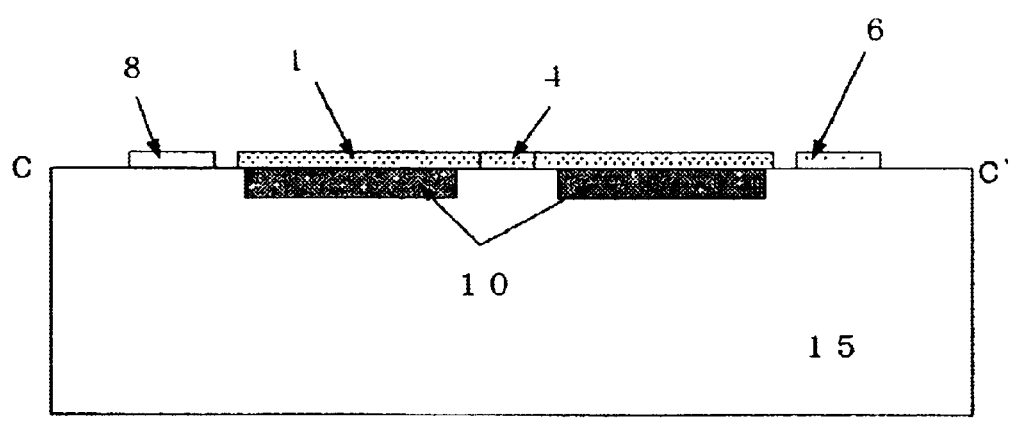
FIG. 7 is a cross-sectional view of the power FET along C–C' line shown in FIG. 4.
Figure 8:
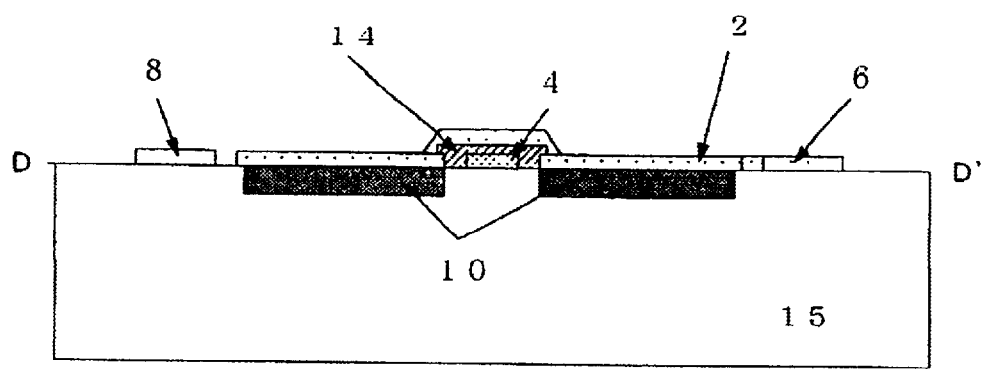
FIG. 8 is a cross-sectional view of the power FET along D–D' line shown in FIG. 4.

As shown in FIG. 4, two rectangular-shaped active regions 10 are arranged in parallel to each other on a semi-insulating GaAs substrate 15, and each of the gate fingers 1 is formed on the corresponding active region 10 connected to each other by a common gate bar 4. Drain fingers 2 and source fingers 3 cross over the gate bar 4 with an insulating layer 14 therebetween as shown in FIG. 5. The gate bar 4 and a gate pad 5 are connected by an upper conducting layer 12 formed on the insulating layer 14 as shown in FIG. 6. Furthermore, the upper conducting layer 12 is overlapped with one of the source fingers with the insulating layer therebetween. A portion of the gate bars 4 which is not overlapped with the source fingers is formed directly on the substrate 15 as shown in FIG. 7, and if the substrate 15 would be covered with a passivation layer such as a silicon nitride film, the portion of the gate bars 4 could be formed on the passivation layer. Each of the drain fingers 2 on the respective active regions 10 is connected to each other crossing over the gate bar 4 as shown in FIG. 8. It is the same as for the source fingers (not shown). Since the upper conducting layer 12 extending over the active regions 10 supplies the gate potential to the gate bar 4, difference in delay time of a gate signal between the transistors 11 is suppressed. Since the gate bar 4 is laid out on the lowest layer, and the drain fingers 2 and source fingers 3 cross over the gate bar 4, the gate bar and gate fingers can be connected to each other by the shortest electric path which is most sensitive to the device characteristics. The upper conducting layer is used for supplying only the gate potential in this embodiment, but could be used for one or more than one of the gate, source and drain potentials. Furthermore, in the case that it is not sufficient for high-frequency signals that the upper conducting layer is merely a conducting layer, it should be designed as a high-frequency wave-guide. When the source potential is the ground potential (supplied to the source fingers 3 in the embodiment), a strip line for a high-frequency wave-guide is provided by designing the upper conducting layer such that the upper conducting layer overlaps the source fingers with the insulating layer therebetween. Furthermore, any desired propagation characteristics can be obtained by properly selecting materials or thickness of the insulating layer, width of the upper conducting layer and so on.

Embodiment 4

Figure 9:
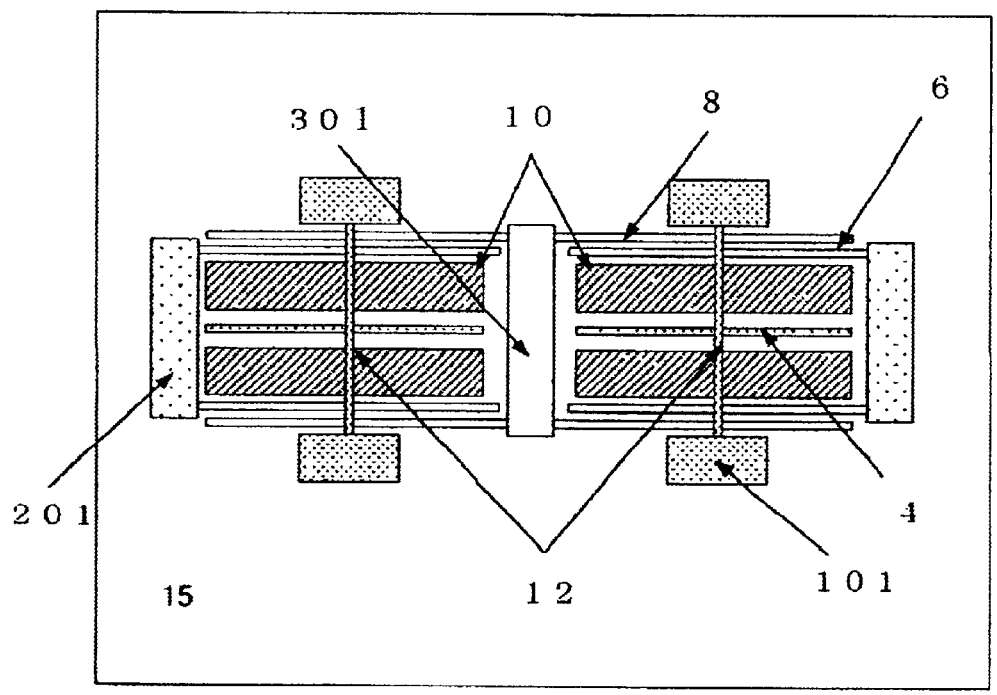
FIG. 9 is a top view of a power FET for the fourth embodiment according to the present invention.

FIG. 9 is a top view of a power FET for the fourth embodiment according to the present invention. Although finger electrodes for gate, drain and source are not shown in this figure, the respective finger electrodes are laid out on active regions in parallel to the width direction thereof.

A highlighted feature of this embodiment is that the active regions 10 are arranged side by side in parallel to each other not only widthwise but also lengthwise. As shown in FIG. 9, a gate pad 101 supplying the gate potential is formed for each of the active regions 10, and that the opposed gate pads across a widthwise in parallel arranged pair of the active regions 10 are connected with each other by the upper conducting layer 12. A gate bar 4 is laid out in an area between the widthwise parallelly arranged pair of the active regions 10, and that connected to the upper conducting layer 12 at a cross point. A pair of drain pads 201 are opposed to each other across the lengthwise parallelly arranged pairs of the active regions 10, and that extended along each shorter outer side of the widthwise parallelly arranged pairs of the active regions 10. A pair of drain bars 6 are parallelly extended from each of the drain pads 201 along the longer outer sides of the widthwise parallelly arranged pairs of the active regions 10. A source pad 301 is laid out between the widthwise parallelly arranged pairs of the active regions 10, and that extended along the shorter inner sides of the widthwise parallelly arranged pairs of the active regions 10. The source pad is led to the back surface of the substrate through a via-hole. As to mounting a semiconductor chip on a package, four gate pads and two drain pads are usually led out by wire bonding to be coupled to the respective common potentials, and otherwise, pads having a common potential could be connected to each other on the chip.

As shown in the foregoing embodiment, a desired amplification can be easily obtained by increasing the number of the active regions. The via-hole is formed at a central area surrounded by the four active regions 10 to prevent heat generated by them from being accumulated there. Since metal is plugged in the via-hole by plating, the via-hole can dissipate the heat so efficiently as to avoid the heat from being accumulated there. The via-hole could be formed for the gate or drain pad instead of the source pad. Furthermore, the active regions are arranged in parallel to each other lengthwise and/or widthwise on a chip plane in the foregoing embodiments. However, "lengthwise and/or widthwise" includes a staggered arrangement in which the active regions are arranged in the direction of 45 degrees from one of the four sides of the rectangular-shaped active region. A common concept shared by the foregoing embodiments is as follows: Miniaturization of interconnection patterns leads to increase of difference in a signal delay due to difference in interconnection resistance from a pad to each of transistors connected in parallel. To avoid this inconvenience, the active region is arranged dividedly such that the interconnection line is short enough to give a tolerable difference in the signal delay. Particularly, the active region is divided in accordance with length of the gate bar, and using multilayer interconnection technique, each bar is connected to the corresponding pad by an upper conducting layer to realize the shortest conducting path. These structural features facilitate high-speed operation of the semiconductor integrated device as a whole without opposing further scale-down of microstructure of the transistors therein.

What is claimed is:

1. A semiconductor device for power amplification comprising:

a semiconductor substrate having opposed first and second surfaces;

an active unit on the first surface of said semiconductor substrate;

at least two active regions being formed in said active unit, each of said active regions having a length direction edge and at least two of said active regions arranged such that said length direction edges are opposed to each other, said active regions are electrically separated by an isolated area;

an upper conducting layer crossing over at least one of said active regions overlaid with an insulating layer and extended to said isolated area; and a plurality of parallel fingers of gate, drain and source electrodes being formed on each of said active regions, said fingers arranged such that a length direction of each of said fingers is perpendicular to a length direction of each of said active regions, and selected one of said gate, drain and source fingers is supplied with a corresponding potential via said upper conducting layer.

2. The semiconductor device according to claim 1, further comprising:

a pad electrically connected to said upper conducting layer, said pad supplying a corresponding electric potential therewith.

3. The semiconductor device according to claim 1, further comprising:

each of gate, source and drain bars formed in a region electrically separated from said active regions on the first surface of said semiconductor substrate, said gate, source and drain bars being connected to said gate, source and drain fingers, respectively to supply respective common electrical potentials therewith.

4. The semiconductor device according to claim 3, wherein said upper conducting layer is connected to at least one of said gate, source and drain bars to supply the corresponding common electrical potential therewith.

5. The semiconductor device according to claim 1, further comprising:

each of gate, source and drain bar formed in a region electrically separated from said active regions on the first surface of said semiconductor substrate, said source and drain bar being connected to said source and drain fingers, respectively to supply respective common electrical potentials therewith, wherein said gate bar is laid out between said active regions, and commonly connected with said gate fingers on corresponding ones of said active regions to supply a common gate electrical potential therewith.

6. The semiconductor device according to claim 5, further comprising:

conductors formed between said active regions, and crossing over and electrically isolated to said gate bar, said conductors being connected with corresponding ones of said source and drain fingers, respectively, wherein each of said source and drain fingers on said active regions are arranged in a straight line.

7. A semiconductor device for power amplification comprising:

a semiconductor substrate having opposed first and second surface;

at least two set of active units on the first surface of said semiconductor substrate;

at least two active regions being formed in each of said active units, each of said active regions having a length direction edge and at least two of said active regions arranged such that said length direction edges are opposed to each other, said active regions are electrically separated by an isolated area;

an upper conducting layer crossing over at least one of said active regions overlaid with an insulating layer and extended to said isolated area; and a plurality of parallel fingers of gate, drain and source electrodes being formed on each of said active regions, said fingers arranged such that a length direction of each of said fingers is perpendicular to a length direction of each of said active regions, and said gate fingers are supplied with a corresponding potential via said upper conducting layer;

wherein each of said active units arranged perpendicular to the length direction of said gate, drain and source fingers.

8. The semiconductor device according to claim 7, further comprising a via-hole penetrating through said semiconductor substrate in a region surrounded by four of said active regions adjacent to each other in both directions parallel and perpendicular to the length direction of said fingers.

9. The semiconductor device according to claim 8, wherein said via-hole is plugged in with an electrode propagating an electric potential between the first surface and the second surface of said semiconductor substrate.

10. The semiconductor device according to claim 9, wherein the electrode plugged in said via-hole is connected to one of the gate, source and drain potentials.

* * * * *